United States Patent
Milner, Jr. et al.

(10) Patent No.: US 9,128,134 B2
(45) Date of Patent: Sep. 8, 2015

(54) CONCURRENT TRANSFORMER TEST SYSTEM AND METHOD

(71) Applicant: AVO Multi-Amp Corporation, Dallas, TX (US)

(72) Inventors: David Hembree Milner, Jr., Grand Prairie, TX (US); John Leonard Shanks, Dallas, TX (US); Harvey Wayne Veselka, Jr., Mesquite, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 308 days.

(21) Appl. No.: 13/660,816

(22) Filed: Oct. 25, 2012

(65) Prior Publication Data

US 2014/0118015 A1 May 1, 2014

(51) Int. Cl.
G01R 29/20 (2006.01)

(52) U.S. Cl.
CPC .................................... *G01R 29/20* (2013.01)

(58) Field of Classification Search
None
See application file for complete search history.

(56) References Cited

U.S. PATENT DOCUMENTS

| | | | |
|---|---|---|---|
| 2,910,646 A | 10/1959 | Schutzner | |
| 5,276,402 A * | 1/1994 | Schucht | 324/726 |
| 5,396,172 A * | 3/1995 | Lat et al. | 324/547 |
| 6,987,390 B2 | 1/2006 | Suss et al. | |
| 2004/0130329 A1 | 7/2004 | Suss et al. | |
| 2005/0212506 A1* | 9/2005 | Khalin et al. | 324/127 |
| 2008/0136426 A1 | 6/2008 | Fawcett | |
| 2012/0158325 A1 | 6/2012 | Banerjee et al. | |

OTHER PUBLICATIONS

AVO MULTI-AMP Corp., Instruction manual for Current Transformer Excitation Test Set model CTER-91, Megger.com, 1992, pp. 1-30.*
Werstiuk, Back to the Basics—Current Transformer Testing, NETA WORLD, Fall-Winter 2004, pp. 1-8.*
"IEEE Guide for Field Testing of Relaying Current Transformers," IEEE Power Engineering Society, IEEE Std C57.13.1—2006, Feb. 28, 2007, 39 pages.
"IEEE Standard Conformance Test Procedure for Instrument Transformers," IEEE Power Engineering Society, IEEE Std C57.13.2—2005, Sep. 29, 2005, 14 pages.
"IEEE Guide for Grounding of Instrument Transformer Secondary Circuits and Cases," IEEE Power Engineering Society, IEEE Std C57.13.3—2005, May 8, 2006, 43 pages.
"IEEE Standard of Performance and Test Requirements for Instrument Transformers of a Nominal System Voltage of 115 kV and Above," IEEE Power Engineering Society, IEEE Std C57.13.5—2005, Aug. 1, 2003, 53 pages.

(Continued)

*Primary Examiner* — Melissa Koval
*Assistant Examiner* — Courtney McDonnough
(74) *Attorney, Agent, or Firm* — Conley Rose, P.C.; J. Robert Brown, Jr.

(57) ABSTRACT

A tester for testing a transformer is provided. The tester comprises a primary voltmeter and a plurality of secondary voltmeters. The tester may also comprise an ammeter in series with a voltage source configured to apply voltage to the transformer. The primary voltmeter is configured to measure voltage induced across a primary winding of the transformer, while the secondary voltmeters may simultaneously measure voltage outputs at secondary windings of the transformer. The tester is configured to calculate ratios, saturation curves, and knee points for multiple winding combinations based on the measurements simultaneously obtained by the ammeter and the primary and secondary voltmeters.

20 Claims, 4 Drawing Sheets

(56) References Cited

OTHER PUBLICATIONS

"IEEE Standard for High-Accuracy Instrument Transformers," IEEE Power Engineering Society, IEEE Std C57.13.6—2005, Dec. 9, 2005, 16 pages.

IEC 60044-1, "Amendment 1, Instrument Transformers—Part 1: Current Transformers," Norme Internationale, International Standard, 1996, 109 pages.

IEC 60044-6, "Instrument Transformers, Part 6: Requirements for Protective Current Transformers for Transient Performance," European Standard, Mar. 1999, 48 pages.

Iwanusiw, Oleh, "The Art and Science of Testing, Relaying Current Transformers," Toronto, Canada, 7 pages.

Iwanusiw, Oleh, "Modern Methods of Testing Relaying CTs," Toronto, Canada, 9 pages.

Iwanusiw, Mr. Oleh W., "CTERP-2000 Comparison With ANSI C57.13.1," Eltel Industries, Bangalore, India, 2 pages.

Elleuch, Mohammed, et al., "Analytical Model of Iron Losses in Power Transformers," IEEE Transactions on Magnetics, vol. 39, No. 2, Mar. 2003, 8 pages.

Amar, M., et al., "A Simple Method for the Estimation of Power Losses in Silicon Iron Sheets Under Alternating Pulse Voltage Excitation," IEEE Transactions on Magnetics, vol. 30, No. 2, Mar. 1994, 3 pages.

PCT International Search Report; Application No. PCT/US2013/066363; Mar. 21, 2014; 2 pages.

PCT Written Opinion of the International Searching Authority; Application No. PCT/US2013/066363; Mar. 21, 2014, 5 pages.

* cited by examiner

CONCURRENT TRANSFORMER TEST SYSTEM AND METHOD

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Many power generation and distribution systems employ current transformers to monitor the flow of current through electrical devices. To ensure proper installation and operation, current transformers are often subjected to one or more tests performed in accordance with well-defined standards, e.g., IEEE C57.13.1, IEC 60044-1, and IEC 60044-6. Examples of these tests include ratio tests, excitation tests, burden tests, polarity tests, winding resistance tests, phase angle tests, etc. To calculate the ratio, excitation curve, and knee point of a current transformer using some traditional test methods, the primary conductor of the transformer must first be disconnected. With the primary circuit open, a test signal can be applied to the secondary winding and the resulting current/voltage in the primary winding may be measured. These results may then be used to determine characteristics used to evaluate the current transformer such as ratio, saturation curve, and knee point.

If the transformer is a multi-ratio current transformer having multiple taps, test leads may be changed (e.g., manually or with a relay switching matrix) and a similar test may be performed similar to that described above. This testing process is typically repeated for each combination of taps. Thus, multiple tests are typically performed to determine the ratios, saturation curves, and knee points for a multi-ratio current transformer. As such, conventional methods for testing current transformers can be relatively labor intensive and time-consuming.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
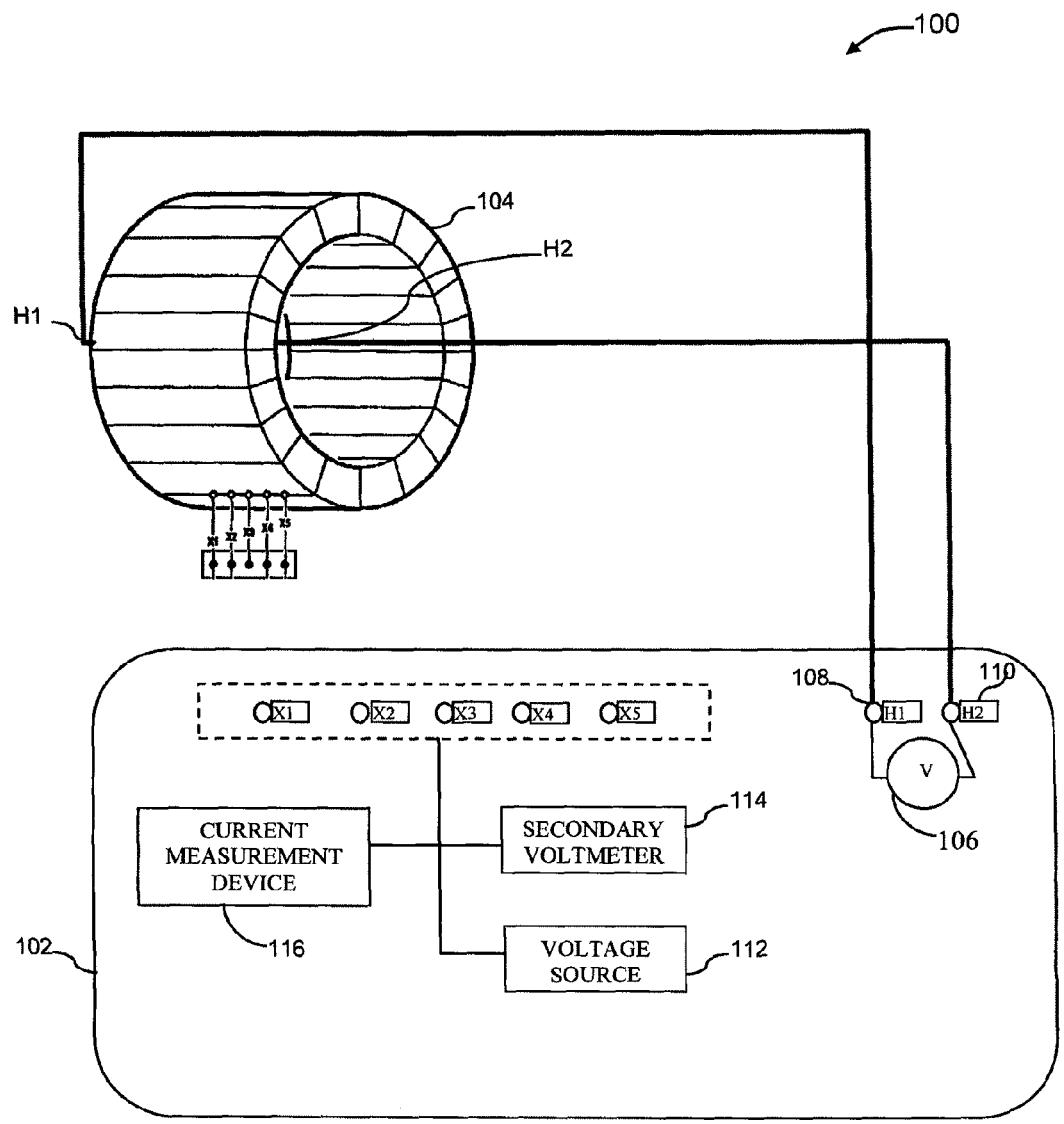
FIG. 1 is a schematic diagram of a transformer test system according to an embodiment of the present disclosure.

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

In an embodiment, a method is provided for testing a transformer. The method comprises applying an input voltage to a secondary winding of the transformer in order to induce a voltage in a primary winding of the transformer. The method includes measuring the induced voltage, and simultaneously measuring secondary voltages in a plurality of secondary windings of the transformer. The method further includes calculating a plurality of winding ratios based on the induced voltage measurement and the secondary voltage measurements.

In an embodiment, a tester is provided for testing a transformer. The tester comprises a voltage source configured to apply an input voltage to a secondary winding of the transformer, wherein the input voltage is configured to induce a voltage in a primary winding of the transformer. The tester includes a primary voltmeter configured to measure the induced voltage in the primary winding, and a plurality of secondary voltmeters configured to simultaneously measure voltage in a plurality of secondary windings of the transformer when the input voltage is applied. The tester further includes at least one processor configured to calculate a plurality of winding ratios based on the induced voltage measurement and the secondary voltage measurements.

In an embodiment, a system is provided for testing a transformer. The system comprises a voltage source configured to apply an input voltage to a secondary winding of the transformer, wherein the input voltage is configured to induce a voltage in a primary winding of the transformer. The system includes a primary voltmeter configured to measure the induced voltage in the primary winding, and a plurality of secondary voltmeters configured to simultaneously measure voltage in a plurality of secondary windings of the transformer when the input voltage is applied. The system further includes a controller operatively connected to the voltage source, the primary voltmeter, and the plurality of secondary voltmeters, wherein the controller is configured to calculate a plurality of winding ratios based on the induced voltage measurement and the secondary voltage measurements.

Disclosed herein are systems, apparatuses, and methods for testing a transformer. In an embodiment, the system comprises a tester including an ammeter, a primary voltmeter, and multiple secondary voltmeters. In operation, the tester may inject a voltage on the external winding of the transformer. In turn, the primary voltmeter may measure the voltage induced across a primary winding of the transformer, while the secondary voltmeters may simultaneously measure voltage outputs at secondary windings of the transformer. The ammeter may also be used to measure current flowing through one or more of windings of the transformer. To reduce testing time, the tester may calculate the ratio, saturation curve, and knee point for each winding combination of the transformer based on the measurements simultaneously obtained by the ammeter and the primary and secondary voltmeters.

Referring to FIG. 1, a schematic diagram of a system 100 according to an embodiment of the present disclosure is shown. The system 100 comprises a portable tester 102 for testing equipment configured to operate at high voltages and/or currents, such as current transformers (CTs), generator current transformers (GCTs), internal bushing current transformers (BCTs), external slipover current transformers, etc.

In the present example, the tester 102 will be described with respect to testing a conventional multi-ratio CT 104 comprising five taps, yet in other implementations the CT 104 may comprise more or less taps. Furthermore, although the testers disclosed herein may generally be described with respect to the arrangements shown in the drawings, it is to be understood that the testers may be differently configured and/or comprise more or less components without departing from the scope of the present disclosure.

The tester 102 comprises a primary voltmeter 106 for measuring the voltage across the primary (or high voltage) winding of the CT 104. The primary voltmeter 106 may include or be linked to a pair of primary connectors 108 and 110 for electrically connecting the primary voltmeter 106 (e.g., via a harness or test leads) to corresponding primary terminals H1 and H2 of the CT 104. While only two primary connectors 108 and 110 are depicted in FIG. 1, the tester 102 may comprise one or more primary connectors in other implementations.

The tester 102 further comprises an AC or DC voltage source 112 configured to supply voltage to a secondary winding of the CT 104. At least one secondary voltmeter 114 is provided for measuring voltage output across the secondary winding, and any suitable current measurement device 116 may be provided to measure current flowing through the secondary winding. The voltage source 112, secondary voltmeter 114, and current measurement device 116 may include or be linked to a plurality of secondary connectors X1, X2, X3, X4, and X5, each of which being electrically attachable (e.g., via test leads or the like) to corresponding secondary terminals x1, x2, x3, x4, and x5 of the CT 104.

To perform a typical ratio test for a secondary winding (e.g., x1-x2) of the CT 104, the primary winding is usually open-circuited to prevent the circulation of current. The voltage source 112 may be connected to the secondary winding (e.g., via connectors X1 and X2) and configured to apply a voltage that may be fixed or adjusted (e.g., until an excitation current reaches saturation). When the voltage source 112 injects a voltage across the secondary winding, the primary voltmeter 106 may measure the voltage induced on the primary winding across the H1 and H2 terminals, and the current measurement device 116 and the secondary voltmeter may measure current and voltage outputs at the secondary terminals (e.g., x1-x2). The tester 102 may then obtain voltage measurements from the primary and secondary voltmeters 104 and 114 to calculate the ratio (e.g., x1-x2:H1-H2) for the tested winding. The tester 202 may also use the ratio and/or other parameters (e.g., current/voltage data) to calculate the saturation curve and knee point for the tested winding.

Typically, the windings of a CT need to be individually tested to obtain the ratio, saturation curve, knee point, or other information for that particular winding. Since the CT 104 in FIG. 1 comprises four separate windings (i.e., x1-x2, x1-x3, x1-x4, and x1-x5), the CT 104 has 10 possible combinations (i.e., x1-x2, x1-x3, x1-x4, x1-x5, x2-x3, x2-x4, x2-x5, x3-x4, x3-x5, x4-x5) that can be tested. After testing one combination, test leads would need to be changed to test another winding combination. This may be achieved manually by a user changing test leads and running a ratio, saturation, knee point test, or automatically by internally switching leads (e.g., via integrated relays). Depending on the testing equipment, it may take about two to six minutes to complete a ratio, saturation, and knee point test for each possible winding combination. Thus, testing a multi-ratio transformer such as the CT 104 can be relatively time consuming.

In some implementations, test leads may be provided for simultaneously attaching one or more of the secondary connectors X1, X2, X3, X4, and X5 of the tester 102 to the corresponding secondary terminals x1, x2, x3, x4, and x5 of the CT 104. As such, the tester 102 may be configured to automatically test all possible winding combinations without any lead switching or user intervention. To reduce overall testing time, a tester according to the present disclosure may be further configured to calculate the ratio for each winding combination based on multiple measurements obtained simultaneously during a single test. These and other features are described below with respect to FIG. 2.

Figure 2:
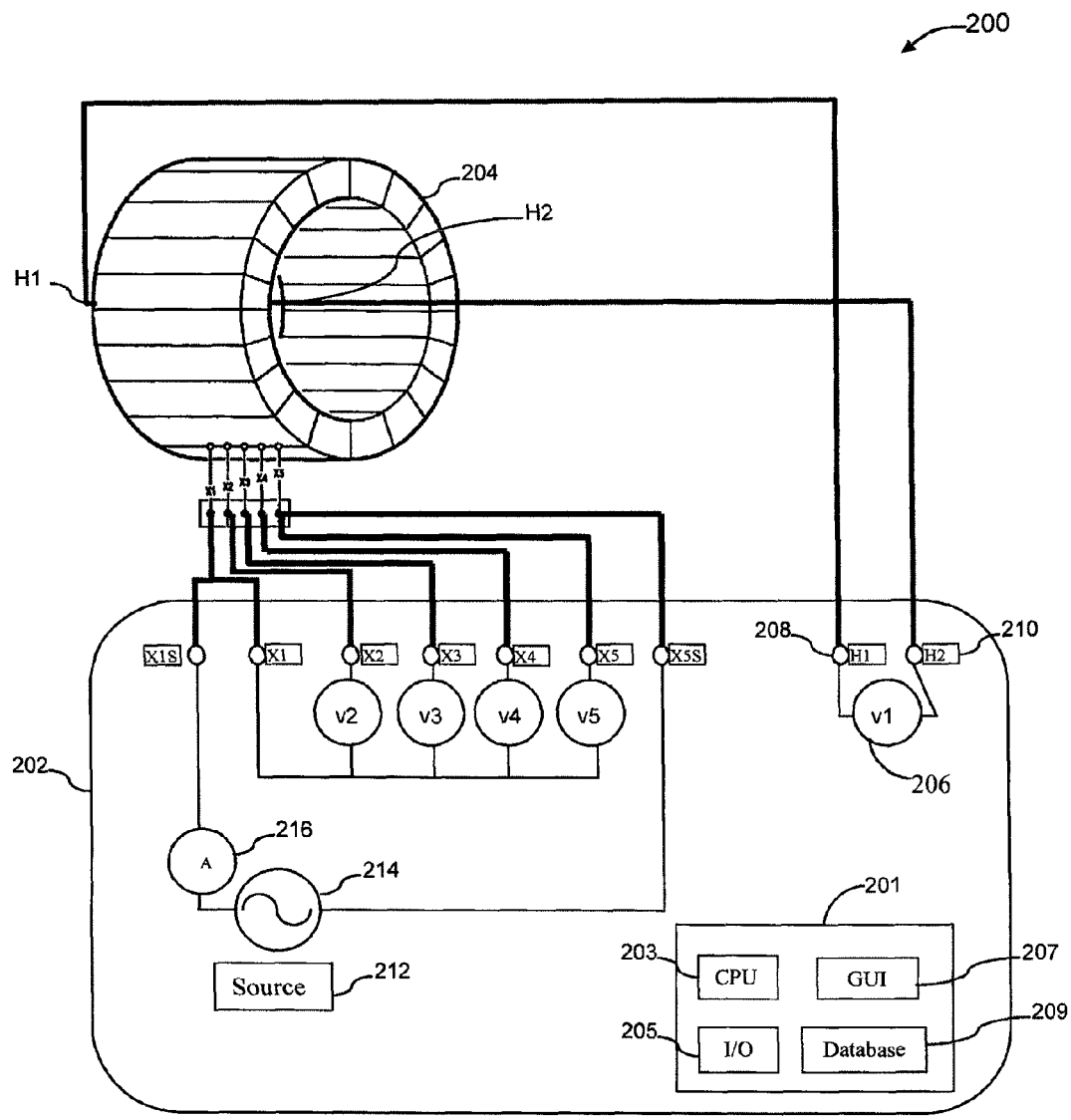
FIG. 2 is a schematic diagram of a transformer test system according to another embodiment of the present disclosure.

FIG. 2 depicts an embodiment of a system 200 comprising a portable tester 202. For convenience, the tester 202 will be described herein with respect to testing a multi-ratio CT 204 substantially similar to the CT 104 in FIG. 1. However, the tester 202 may be used for testing any suitable equipment configured to operate at high voltages and/or currents. Given the nature in which testing devices such as the tester 202 are often employed, the tester 202 may be ruggedized and shielded appropriately to withstand adverse conditions such as when operating in harsh electrical environments of a power generation and/or distribution station.

The tester 202 may comprise a controller 201 for controlling one or more components associated with the tester 202. The controller 201 may include or be operatively connected to a processor such as a microprocessor, microcontroller, or digital signal processor having a central processing unit (CPU) 203. The controller 201 may also include or be operatively connected to at least one input/output (I/O) component 205, graphical user interface (GUI) 207, and database 209 may be provided. In some implementations, the controller 201, CPU 203, I/O component 205, GUI 207, and/or database 209 may be integrated as one or more units.

The tester 202 comprises a primary voltmeter (v1) 206 for measuring the voltage across the primary winding of the CT 204. The primary voltmeter 206 may include or be linked to a pair of primary connectors 208 and 210 for electrically connecting the primary voltmeter 206 (e.g., via one or more supply leads) to corresponding primary terminals H1 and H2 of the CT 204. In other implementations, the tester 202 may comprise one or more primary connectors. The tester 202 further comprises a primary power source 212, which may be linked to mains voltage and/or other power supplies capable of providing sufficient current and/or voltage. The primary power source 212 may include or be linked to an AC or DC voltage source 214 configured to supply voltage to at least one secondary winding of the CT 204. The voltage source 214 may be connected in series with an ammeter 216 or other suitable device(s) configured to measure current flowing through at least one secondary winding of the CT 204.

In an embodiment, the tester 202 comprises a plurality of secondary voltmeters v2, v3, v4, and v5, each of which may include or be linked to a plurality of secondary connectors X2M, X3M, X4M, and X5M, respectively. The tester 202 may further comprise a pair of external connectors X1S and X5S that may be linked to the voltage source 214 and ammeter 216. In some contexts, the primary power source 212, voltage source 214, and/or ammeter 216 may be linked to one or more of the voltmeters v1, v2, v3, v4, v5 and connectors X1M, X2M, X3M, X4M, X5M, X1S, X5A. Furthermore, the tester 202 may comprise a secondary voltmeter that includes or is linked to the X1M secondary connector. In the implementation shown in FIG. 2, however, a secondary voltmeter corresponding to X1M is not necessary since the voltage output is generally assumed to be a known reference voltage (e.g., 0 volts).

As shown in FIG. 2, each of the secondary connectors X1M, X2M, X3M, X4M, and X5M of the tester 202 may be attached (e.g., via supply leads or the like) to corresponding secondary terminals x1, x2, x3, x4, and x5 of the CT 104. Similarly, the external connectors X1S and X15 may each be attached to corresponding terminals x1 and x5 of the CT 204. When the components of the tester 202 are attached as shown, the voltage source 214 may apply a fixed or variable voltage to a secondary winding of the CT 204. The secondary voltmeters v2, v3, v4, and v5 can then be used to simultaneously measure voltage output from each secondary terminal x1, x2, x3, x4, and x5 of the CT 204, while the primary voltmeter 206 can be used to measure voltage output across the primary terminals H1 and H2 of the CT 204. Additionally, the ammeter 216 may be used to measure current flowing through one or more of the secondary windings of the CT 204. In some implementations, measurements from the primary voltmeter 206, secondary voltmeters v2, v3, v4, and v5, and/or ammeter 216 may be displayed (e.g., via GUI 207) and/or stored (e.g., in database 209).

The tester 202 may obtain and process (e.g., via controller 201) measurements from the secondary voltmeters v2, v3, v4, and v5, the primary voltmeter 206, and/or the ammeter 216. As discussed below, the tester 202 may use these measurements and/or other information (e.g., current/voltage inputs at the primary/secondary windings, data provided from a nameplate and/or manufacturer of the CT 204, etc.) in order to perform calculations and tests for analyzing the CT 204. Some CT tests the tester 202 may be configured to perform included, but are not limited, a ratio test, saturation test, knee point test, polarity test, winding resistance test, magnetizing test, phase angle test, core loss test, load loss test, or any combination thereof. Additionally, the tester 202 may perform a CT test according to predefined and/or customizable algorithms and sequences.

When the voltage source 214 applies a voltage to the external winding (i.e., x1-x5), the tester 202 may perform a ratio test to determine the secondary to primary ratio (i.e., x1-x5: H1-H5) using voltage measurements across secondary terminals x1 and x5 and primary terminals H1 and H2. The tester 202 may use the secondary to primary ratio to calculate the saturation curve and knee point for the external winding (x1-x5) of the CT 204. In an embodiment, in addition to calculating the ratio, saturation curve, and knee point for the external winding (x1-x5), the tester 202 may calculate the ratio, saturation curve, and knee point for one or more other winding combinations by using measurements obtained during the same test.

That is, the tester 202 may perform a concurrent ratio test in which it uses simultaneous measurements to calculate a plurality of ratios by running a single test. As previously mentioned, multiple tests typically need to be performed to calculate the ratio for each winding combination of a CT. However, the tester 202 comprises multiple secondary voltmeters v2, v3, v4, and v5 that can simultaneously measure secondary voltages (e.g., at terminals x1, x2, x3, x4, and x5) as the primary voltmeter 206 measures the voltage induced across the primary winding of the CT 204. Based on the secondary and primary voltage measurements, the tester 202 may calculate the ratio for each winding (i.e., x1-x2, x1-x3, x1-x4, and x1-x5), as well as the ratio for each possible winding combination.

In an embodiment, so long as the measured ratio for each winding is known, all other CT saturation and knee point information can be mathematically derived using equations according to the present disclosure. For instance, the tester 202 may calculate the ratio, saturation curve, and/or knee point for the external winding (x1-x5) using measurements from the ammeter 216, the primary voltmeter 206, and the secondary voltmeter v5. Based on these calculations, the tester 202 may also calculate the ratio for the other three windings x1-x2, x1-x3, and x1-x4 by using measurements obtained from one or more secondary voltmeters v2, v3, v4, and v5. The secondary to primary ratio for each winding (i.e., x1-x2, x1-x3, x1-x4, and x1-x5) may generally be expressed as follows:

$N_{x1-x2}$=x1-x2:H1-H2, $N_{x1-x3}$=x1-x3:H1-H2, $N_{x1-x4}$=x1-x4:H1-H2, and $N_{x1-x5}$=x1-x5:H1-H2.

In an embodiment, the tester 202 may be configured to calculate the secondary to primary ratios above, as well as associated current/voltage information, using the following equations:

$$V \text{ winding } a = V \text{ measured winding } x \times \left(\frac{\text{Ratio measured winding } x}{\text{Ratio measured winding } a}\right), \quad (1)$$

and $$C \text{ winding } a = C \text{ measured winding } x \times \left(\frac{\text{Ratio measured winding } x}{\text{Ratio measured winding } a}\right). \quad (2)$$

The parameters in the equations above may be defined as follows:

V measured winding x=Voltage point measured of winding actually tested (e.g., external winding x1-x5), V measured winding a=Voltage point measured of winding untested for Saturation and Knee point (e.g., internal winding x2-x3), Ratio measured winding x=Measured ratio of winding actually tested, Ratio measured winding a=Measured ratio of winding untested for Saturation and knee point, C measured winding x=Current point measured of winding actually tested, and C measured winding a=Current point measured of winding untested for Saturation and Knee point.

It can be seen that the tester 202 may solve any unknown variables in equations (1) and (2) by using measurements simultaneously obtained (e.g., as the primary voltmeter 206 measures voltage across terminals H1 and H2) by the secondary voltmeters v2, v3, v4, and v5 and ammeter 216. Thus, by simultaneously measuring all secondary voltages at terminals x1 (e.g., assumed to be 0 V or otherwise known), x2, x3, x4, x5, the tester 202 may use equations (1) and (2) above to calculate the secondary to primary ratio for each winding (i.e., x1-x2, x1-x3, x1-x4, and x1-x5). In turn, the tester 202 may use these same equations to calculate the ratios for the remaining winding combinations (i.e., x2-x3, x2-x4, x2-x5, x3-x4, x3-x5, x4-x5) based on the calculated winding ratios (i.e., $N_{x1-x2}$, $N_{x1-x3}$, $N_{x1-x4}$, $N_{x1-x5}$). The ratios for the remaining winding combinations may generally be expressed as follows:

$N_{x2-x3}$=x2-x3:H1-H2, $N_{x2-x4}$=x2-x4:H1-H2, $N_{x2-x5}$=x2-x5:H1-H2, $N_{x3-x4} = x3-x4:H1-H2$, $N_{x3-x5} = x3-x5:H1-H2$, and $N_{x4-x5} = x4-x5:H1-H2$.

As with calculating the secondary to primary ratio for each winding, the tester 202 may solve any unknown variables in equations (1) and (2) to calculate the remaining ratios ($N_{x2-x3}$, $N_{x2-x4}$, $N_{x2-x5}$, $N_{x3-x4}$, $N_{x3-x5}$, $N_{x4-x5}$) using information simultaneously obtained (e.g., via primary voltmeter 206, secondary voltmeters v2, v3, v4, and v5, and/or ammeter 216) during a single test. Accordingly, by arranging an ammeter 216 and multiple secondary voltmeters v2, v3, v4, and v5 to simultaneously measure outputs at the secondary windings as a primary voltmeter 206 measures voltage induced across the primary winding, the tester 202 may obtain all current/voltage measurements necessary to calculate the ratios for each winding combination using equations (1) and (2) above.

In some implementations, the tester 202 may use the measured ratios ($N_{x1-x2}$, $N_{x1-x4}$, $N_{x1-x5}$, $N_{x2-x3}$, $N_{x2-x4}$, $N_{x2-x5}$, $N_{x3-x4}$, $N_{x3-x5}$, and $N_{x4-x5}$) and current/voltage data in performing CT tests to generate saturation curves and/or determine knee points. Moreover, the tester 202 may use excitation curves from the manufacturer of the CT 202 and/or previously generated (e.g., via tester 202) to compare the results for accuracy. In sum, the tester 202 may perform one or more suitable CT tests to confirm whether a CT (e.g., as supplied) is of the correct accuracy rating, has any shorted turns, and if any wiring or physical short circuits have developed in the primary or secondary windings after installation. Test results may be stored in a local (e.g., in database 207) and/or remote database for comparison with other results and information. Further, the tester 202 may be optionally coupled to a local or remote printer to print test results.

In some embodiments, the tester 202 (or controller 201) may receive inputs (e.g., via I/O 205) that are used to define test types (e.g., ratio tests, burden tests, polarity tests, excitation tests, knee point tests, phase angle tests, impedance tests, insulation tests, resistance tests, magnetization tests, etc.), test values, and/or parameter values. Such inputs may be in the form of alphanumeric text entered into fields of a displayable test form. Additionally or alternatively, inputs may be at least partly in the form of selections via a display (e.g., GUI 207) providing menu drop-down buttons or options. Inputs may define the direction of current flow in the power system component under test, for example, the CT 204. Inputs may also define the amount of current or voltage provided by the tester 202 to a tested component. Inputs may also define an expected resistance range of the transformer windings. Furthermore, the tester 202 may receive inputs to command test state transitions, e.g., a start command, stop command, repeat command, etc. Additionally or alternatively, the tester 202 may receive inputs to command what is displayed by the display component, e.g., applied current, measured voltage or calculated resistance.

In an embodiment, the tester 202 may include one or more analog-to-digital converters to capture the voltage and/or current of a tested device (e.g., CT 204) and other circuitry to store the digital values in a memory (e.g., 209). Moreover, the tester 202 (or controller 201) may include other circuitry or processing capabilities to analyze captured responses to determine a test result parameter. Test result parameters may include, but are not limited to, a resistance of a winding, an impedance of a winding or insulation, polarity of the transformer, burden, or any combination thereof. The tester 202 (or controller 201) may receive and analyze unprocessed data to determine one or more test result parameters.

In an embodiment, the tester 202 may be self-contained such that all or most of its components may be contained within a single unit or case. The tester 202 may readily be employed for testing power system components other than transformers, including instrument transformers, cables, generators, electric motors, rotating machines, batteries, protection relays, circuit breakers, etc.

While discussion of the tester 202 may generally be limited with respect to the tester shown in FIG. 2 and features disclosed herein, those versed in the art will appreciate that the tester 202 may comprise additional or alternative circuitry and components commonly employed in devices employed for testing generators, transformers, and the like. Briefly, for example, the tester 202 may comprise or be operatively connected to at least one analog-to-digital converter (ADC), digital-to-analog converter (DAC), amplifier, multiplexer, inverter, filter, resistor, capacitor, etc.

Figure 3:
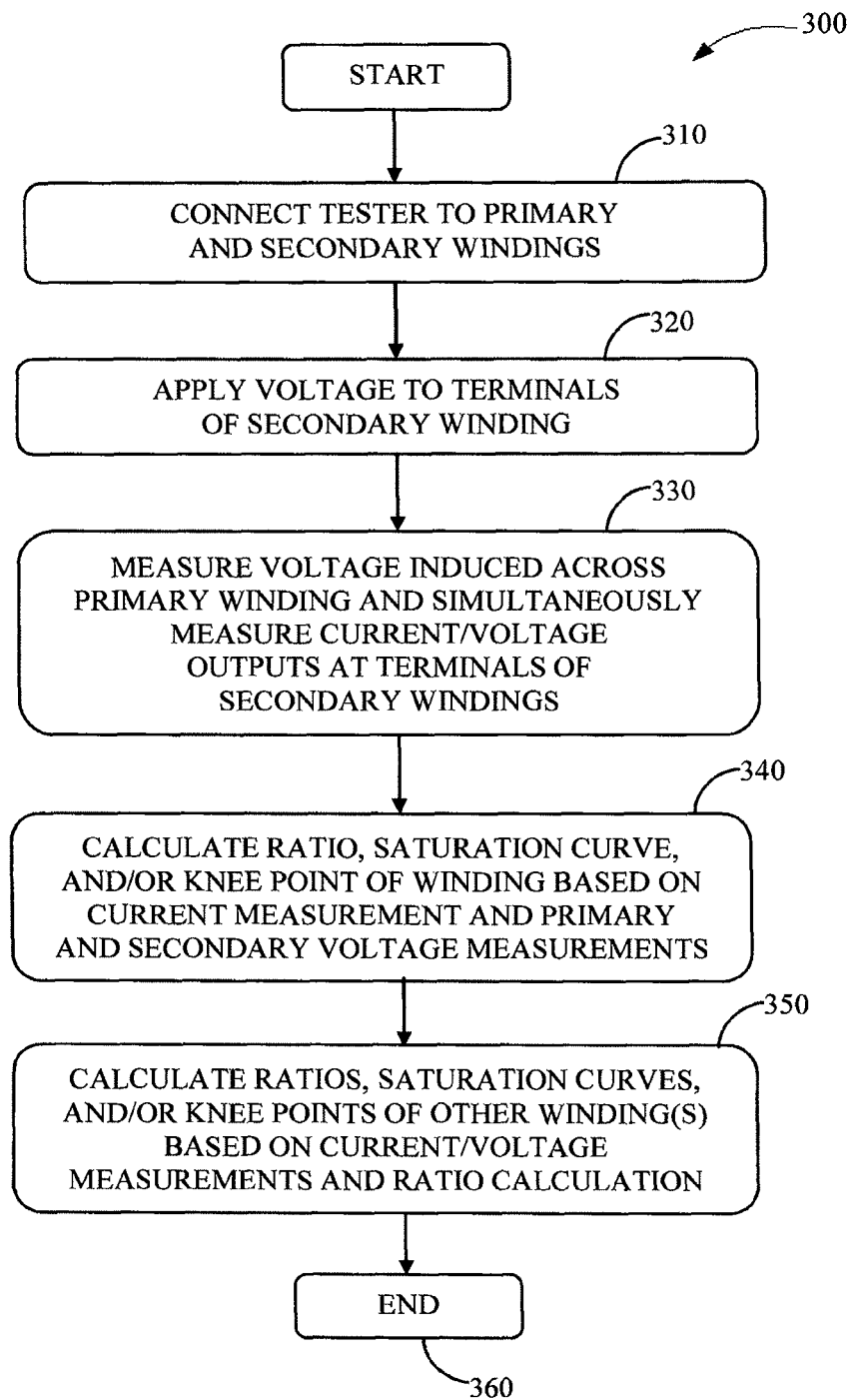
FIG. 3 is a flowchart of a method for testing a transformer according to an embodiment of the present disclosure.

Turning now to FIG. 3, a block diagram of a method 300 for testing a CT is described. The method 300 comprises connecting a tester to the terminals of the secondary and primary windings of the CT at block 310. At block 320, a voltage is applied to the terminals of a secondary winding of the CT. In some embodiments, the voltage applied in block 320 is to the external winding (e.g., x1-x5) of the CT. At block 330, the method 300 includes measuring voltage induced on the primary winding while simultaneously measuring current and/or voltage outputs at the terminals of multiple secondary windings. In some embodiments, voltage outputs at the terminal of each secondary winding are simultaneously measured in block 330.

Continuing with block 340, the ratio, saturation curve, and/or knee point of the winding to which voltage was applied in block 320 is calculated based on the current and the primary and secondary voltage measurements of that winding. At block 350, the ratio, saturation curve, and/or knee point of one or more other windings are calculated based on the current/voltage measurements from block 330 and the ratio calculated in block 340. Thus, the method 300 may calculate the ratio for all possible winding combinations in block 350. The method ends at block 360.

The systems and features described above may comprise one or more processing components capable of executing instructions related to the methods and/or operation disclosed herein. For instance, all or parts of the testers (e.g., 202) described above may be implemented using at least one general-purpose computer or network component with sufficient processing power, memory resources, and network throughput capability to handle the necessary workload placed upon it. Additionally, appropriate mechanical and electrical shielding may be provided to protect the general-purpose computer or network component from harsh environments (e.g., electrical power systems) in which it might be employed.

Figure 4:
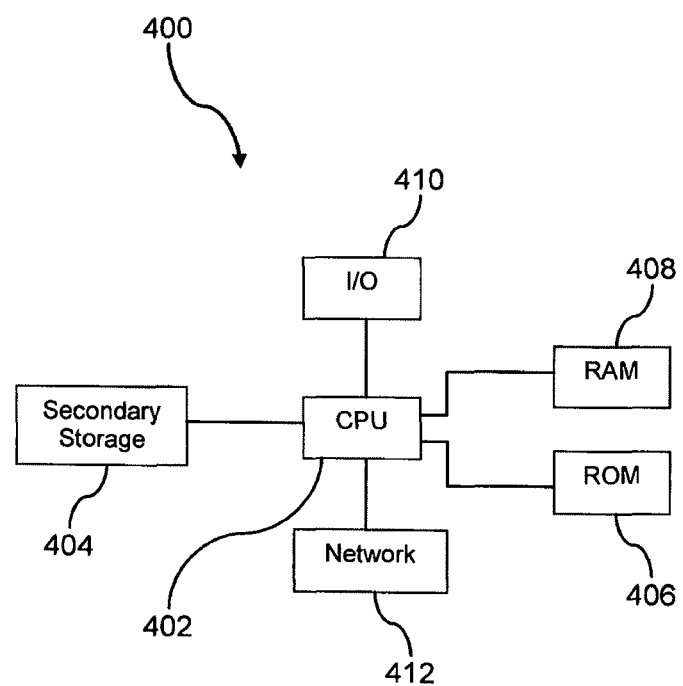
FIG. 4 is a schematic diagram of a computer according to an embodiment of the disclosure.

Turning now to FIG. 4, an embodiment of a computer system 400 will now be described. The computer system 400 may be used to implement any of the systems, components, and/or methods disclosed herein. The computer system 400 includes a central processor unit (CPU) 402 or processor that is in communication with memory devices including secondary storage 404, read only memory (ROM) 406, random access memory (RAM) 408, input/output (I/O) devices 410, and network connectivity devices 412. The processor may be implemented as one or more CPU chips.

The secondary storage 404 is typically comprised of one or more disk drives or tape drives and is used for non-volatile storage of data and as an over-flow data storage device if RAM 408 is not large enough to hold all working data. Secondary storage 404 may be used to store programs which are loaded into RAM 408 when such programs are selected for execution. The ROM 406 is used to store instructions and perhaps data which are read during program execution. ROM 406 is a non-volatile memory device which typically has a small memory capacity relative to the larger memory capacity of secondary storage. The RAM 408 is used to store volatile data and perhaps to store instructions. Access to both ROM 406 and RAM 408 is typically faster than to secondary storage 584.

I/O devices 410 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 412 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or industrial, scientific, medical (ISM) band radio transceiver cards, and other well-known network devices. These network connectivity devices 412 may enable the processor 402 to communicate with an Internet or one or more intranets. With such a network connection, it is contemplated that the processor 402 might receive information from the network, or might output information to the network in the course of performing the above-described method steps. Such information, which is often represented as a sequence of instructions to be executed using processor 402, may be received from and outputted to the network, for example, in the form of a computer data signal embodied in a carrier wave Such information, which may include data or instructions to be executed using processor 402 for example, may be received from and outputted to the network, for example, in the form of a computer data baseband signal or signal embodied in a carrier wave. The baseband signal or signal embodied in the carrier wave generated by the network connectivity devices 412 may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 402 executes instructions, codes, computer programs, scripts which it accesses from hard disk, floppy disk, optical disk (these various disk based systems may all be considered secondary storage 404), ROM 406, RAM 408, or the network connectivity devices 412. While only one processor 402 is shown, multiple processors may be present. Thus, while instructions may be discussed as executed by a processor, the instructions may be executed simultaneously, serially, or otherwise executed by one or multiple processors.

In some implementations, any of the various embodiments and aspects disclosed herein may be combined with the computer system 400 or component(s) thereof. In an embodiment, at least one computer readable medium is provided. The computer readable medium may be configured to store computer readable instructions executable by at least one processor (e.g., CPU 402) of a computing device to cause said computing device to implement any of the aspects described herein. The computer readable medium may be configured to receive data from one or more components or sources associated with the various aspects disclosed herein. Moreover, the at least one processor may use this and/or other data to cause said computing device to calculate measurements (e.g., current and/or voltage ratios) and/or perform various tests associated with transformers or the like.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method for testing a transformer, the method comprising:
    applying an input voltage to a secondary winding of the transformer in order to induce a voltage in a primary winding of the transformer;
    measuring the induced voltage in the primary winding and simultaneously measuring secondary voltages in a plurality of secondary windings of the transformer; and
    calculating by a processor, a plurality of winding ratios based on the induced voltage measurement and the secondary voltage measurements.

2. The method of claim 1, further comprising simultaneously measuring current flowing through at least one of the secondary windings while measuring the secondary voltages in the secondary windings of the transformer.

3. The method of claim 2, wherein the secondary winding to which the input voltage is applied corresponds to an external winding of the transformer, wherein the transformer is a multi-ratio current transformer (CT) comprising at least two primary terminals H1 and H2 and a number N of secondary terminals X1 ... XN (N≥2).

4. The method of claim 3, wherein calculating the plurality of winding ratios includes calculating a primary to secondary ratio of the voltage induced in the primary winding to the input voltage (X1-XN:H1-H2) and at least one other ratio of the voltage induced in the primary winding to one or more of the secondary voltage measurements.

5. The method of claim 4, further comprising calculating the at least one other primary to secondary ratio based on the current measurement, the secondary voltage measurements, and/or the primary to secondary ratio calculation (X1-XN:H1-H2).

6. The method of claim 3, wherein N comprises 5 secondary terminals X1, X2, X3, X4, and X5, wherein calculating the plurality of winding ratios based on the induced voltage measurement and the secondary voltage measurements comprises calculating a plurality of primary to secondary ratios corresponding to X1-X2:H1-H2, X1-X3:H1-H2, X1-X4:H1-H2, X1-X5:H1-H2, X2-X3:H1-H2, X2-X4:H1-H2, X2-X5:H1-H2, X3-X4:H1-H2, X3-X5:H1-H2, X4-X5:H1-H2 or a combination thereof.

7. The method of claim 6, further comprising calculating at least one of a plurality of saturation curves or a plurality of knee points based on the plurality of primary to secondary ratio calculations.

8. A tester for testing a transformer, the tester comprising:
a voltage source configured to apply an input voltage to a secondary winding to induce a voltage in a primary winding of the transformer, wherein the transformer is a multi-ratio current transformer (CT) comprising multiple taps;
a primary voltmeter configured to measure the induced voltage in the primary winding;
a plurality of secondary voltmeters configured to simultaneously measure voltages in a plurality of secondary windings of the CT when the input voltage is applied; and
at least one processor configured to calculate a plurality of winding ratios based on the induced voltage measurement and the secondary voltage measurements.

9. The tester of claim 8, further comprising:
an ammeter configured to simultaneously measure current flowing through at least one of the secondary windings while the plurality of secondary voltmeters measure the secondary voltages in the secondary windings; and
a plurality of secondary terminals configured to connect the plurality of voltmeters and the ammeter to the plurality of secondary windings.

10. The tester of claim 9, wherein the secondary winding to which the input voltage is applied corresponds to an external winding of the CT, wherein the voltage source applies the input voltage to the external winding via at least one external port on the tester.

11. The tester of claim 10, wherein the plurality of winding ratios includes a primary to secondary ratio corresponding to the external winding and at least one other primary to secondary ratio corresponding to another secondary winding of the transformer.

12. The tester of claim 11, wherein the at least one processor calculates the at least one other primary to secondary ratio corresponding to another secondary winding based on the current flow measurement, the secondary voltage measurements, and the primary to secondary ratio calculation corresponding to the external winding.

13. The tester of claim 10, wherein the plurality of winding ratios comprise primary to secondary ratios corresponding to each possible tap selected from the multiple taps, wherein the at least one processor is configured to calculate up to 10 primary to secondary ratios based on the induced voltage measurement, the secondary voltage measurements, and the current flow measurement.

14. The tester of claim 13, wherein the at least one processor is further configured to calculate at least one of a plurality of saturation curves or a plurality of knee points based on the plurality of primary to secondary ratio calculations.

15. A system for testing a transformer, the system comprising:
a voltage source configured to apply an input voltage to a secondary winding to induce a voltage in a primary winding of the transformer, wherein the transformer is a multi-ratio current transformer (CT) comprising multiple taps;
a primary voltmeter configured to measure the induced voltage in the primary winding;
a plurality of secondary voltmeters configured to simultaneously measure voltage in a plurality of secondary windings of the CT when the input voltage is applied; and
a controller operatively connected to the voltage source, the primary voltmeter, and the plurality of secondary voltmeters, wherein the controller is configured to calculate a plurality of winding ratios based on the induced voltage measurement and the secondary voltage measurements.

16. The system of claim 15, further comprising an ammeter operatively connected to the controller, wherein the ammeter is configured to simultaneously measure current flowing through at least one of the secondary windings while the plurality of secondary voltmeters measure the secondary voltages in the plurality of secondary windings of the CT.

17. The system of claim 16, wherein the secondary winding to which the input voltage is applied corresponds to an external winding of the CT, and
wherein the plurality of winding ratios includes a primary to secondary ratio corresponding to the external winding and at least one other primary to secondary ratio corresponding to another secondary winding of the CT.

18. The system of claim 17, wherein the controller is configured to calculate the at least one other primary to secondary ratio corresponding to another secondary winding based on the current flow measurement, the secondary voltage measurements, and the primary to secondary ratio calculation corresponding to the external winding.

19. The system of claim 17, wherein the plurality of winding ratios comprise primary to secondary ratios corresponding to each possible tap selected from the multiple taps, wherein the controller is configured to calculate up to 10 primary to secondary ratios based on the induced voltage measurement, the secondary voltage measurements, and the current flow measurement.

20. The system of claim 19, wherein the controller is further configured to calculate at least one of a plurality of saturation curves or a plurality of knee points based on the plurality of primary to secondary winding ratio calculations.

* * * * *

UNITED STATES PATENT AND TRADEMARK OFFICE
CERTIFICATE OF CORRECTION

PATENT NO. : 9,128,134 B2
APPLICATION NO. : 13/660816
DATED : September 8, 2015
INVENTOR(S) : Milner, Jr. et al.

Page 1 of 1

It is certified that error appears in the above-identified patent and that said Letters Patent is hereby corrected as shown below:

In the Specification

Column 7, Lines 20-21 replace "($N_{x1-x2}$, $N_{x1-x4}$, $N_{x1-x5}$, $N_{x2-x3}$, $N_{x2-x4}$, $N_{x2-x5}$, $N_{x3-x4}$, $N_{x3-x5}$, and $N_{x4-x5}$)"

with -- ($N_{x1-x2}$, $N_{x1-x3}$, $N_{x1-x4}$, $N_{x1-x5}$, $N_{x2-x3}$, $N_{x2-x4}$, $N_{x2-x5}$, $N_{x3-x4}$, $N_{x3-x5}$, and $N_{4-x5}$) --

Signed and Sealed this
Twelfth Day of January, 2016

Michelle K. Lee
*Director of the United States Patent and Trademark Office*